(12) United States Patent
Muller et al.

(10) Patent No.: US 9,536,614 B2
(45) Date of Patent: Jan. 3, 2017

(54) COMMON SOURCE ARCHITECTURE FOR SPLIT GATE MEMORY

(71) Applicant: FREESCALE SEMICONDUCTOR, INC., Austin, TX (US)

(72) Inventors: Gilles J. Muller, Austin, TX (US); Ronald J. Syzdek, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/696,013

(22) Filed: Apr. 24, 2015

(65) Prior Publication Data

US 2016/0314846 A1 Oct. 27, 2016

(51) Int. Cl.
G11C 16/06 (2006.01)
G11C 16/14 (2006.01)
G11C 16/08 (2006.01)

(52) U.S. Cl.
CPC ............. *G11C 16/14* (2013.01); *G11C 16/08* (2013.01)

(58) Field of Classification Search
CPC ............ G11C 16/08; G11C 16/30; G11C 8/08
USPC .................. 365/185.23, 185.01, 185.05, 185.18, 365/185.29
See application file for complete search history.

(56) References Cited

U.S. PATENT DOCUMENTS

| 5,828,607 | A | 10/1998 | Bushey et al. |
| 5,847,996 | A | 12/1998 | Guterman et al. |
| 6,459,616 | B1 | 10/2002 | Beauchamp et al. |
| 7,468,918 | B2 | 12/2008 | Dong et al. |
| RE40,976 | E | 11/2009 | Bergemont et al. |
| 7,668,018 | B2 | 2/2010 | Syzdek et al. |
| 7,944,749 | B2 | 5/2011 | Lee et al. |
| 7,978,518 | B2 | 7/2011 | Pyeon et al. |
| 2009/0180334 | A1* | 7/2009 | Syzdek .............. G11C 16/0433 365/185.29 |
| 2012/0176844 | A1* | 7/2012 | Cunningham .......... G11C 11/14 365/185.22 |

OTHER PUBLICATIONS

Kadowaki et al, "A New Architecture for High-Density High-Performance SGT nor Flash Memory", IEEE Transactions on Circuits and Systems II: Express Briefs, Jun. 17, 2008, pp. 551-555, vol. 55, Issue 6.
Cho et al, "A novel self-aligned highly reliable sidewall split-gate flash memory", IEEE Transactions on Electron Devices, Mar. 2006, pp. 465-473, vol. 53, Issue 3.
(Continued)

*Primary Examiner* — Connie Yoha

(57) ABSTRACT

A memory system has an array of split gate non-volatile NVM cells that are in program sectors and the program sectors make up one or more erase sectors. The control gate of cells in a program sector are physically connected. A program/erase circuit programs a selected program sector by applying a programming signal to the control gates of the split gate memory cells of the selected program sector while applying a non-programming signal to the control gates of program sectors not selected for programming, that erases an erase sector comprising a plurality of the program sectors by contemporaneously applying an erase voltage to the control gates of the split gate NVM cells of the erase sector, wherein during the applying the programming signal, the program/erase circuit applies a source voltage to the sources of each of the split gate NVM cells of the erase sector.

20 Claims, 8 Drawing Sheets

(56) References Cited

OTHER PUBLICATIONS

Bukethal et al., "Analysis and Optimization of Program Disturb in Split-gate Cells using Source Side Injection and Impact on Further Cell Size Reduction," Semiconductor Conference Dresden-Grenoble (ISCDG), 2013 International, 3 pages.
Wang et al., "Novel Cycling-induced Program Disturb of Split Gate Flash Memory," 2007 IEEE International Reliability Physics Symposium Proceedings. 45th Annual. pp. 558-563.

* cited by examiner

|  | SRC | CG |
|---|---|---|
| SELECTED SECTOR 910 | P (5V)<br>E (0V) | P (9V)<br>E (15V) |
| COMMON SOURCE UNSELECTED SECTOR 920 | P (5V)<br>E (0V) | R (1.5V)<br>E (15V) |
| UNSELECTED SECTOR 930 | R (0V) | R (1.5V) |

FIG. 9

COMMON SOURCE ARCHITECTURE FOR SPLIT GATE MEMORY

BACKGROUND

Field

This disclosure relates generally to integrated circuit devices, and more specifically, to driver circuitry of memory arrays.

Related Art

Many integrated circuit devices include memory devices to store data, where a memory device includes a number of memory cells. Driver circuitry is used to select memory cells in the memory device during read, program, and erase operations. Generally, as memory cells scale with technology, high voltage drivers take a larger proportion of the memory area, making it difficult to build memory devices while minimizing area overhead.

BRIEF DESCRIPTION OF THE DRAWINGS

The present invention may be better understood, and its numerous objects, features, and advantages made apparent to those skilled in the art by referencing the accompanying drawings.

FIG. 9 is a chart illustrating example sets of voltages applied to sectors during program and erase operations, according to some embodiments.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1:
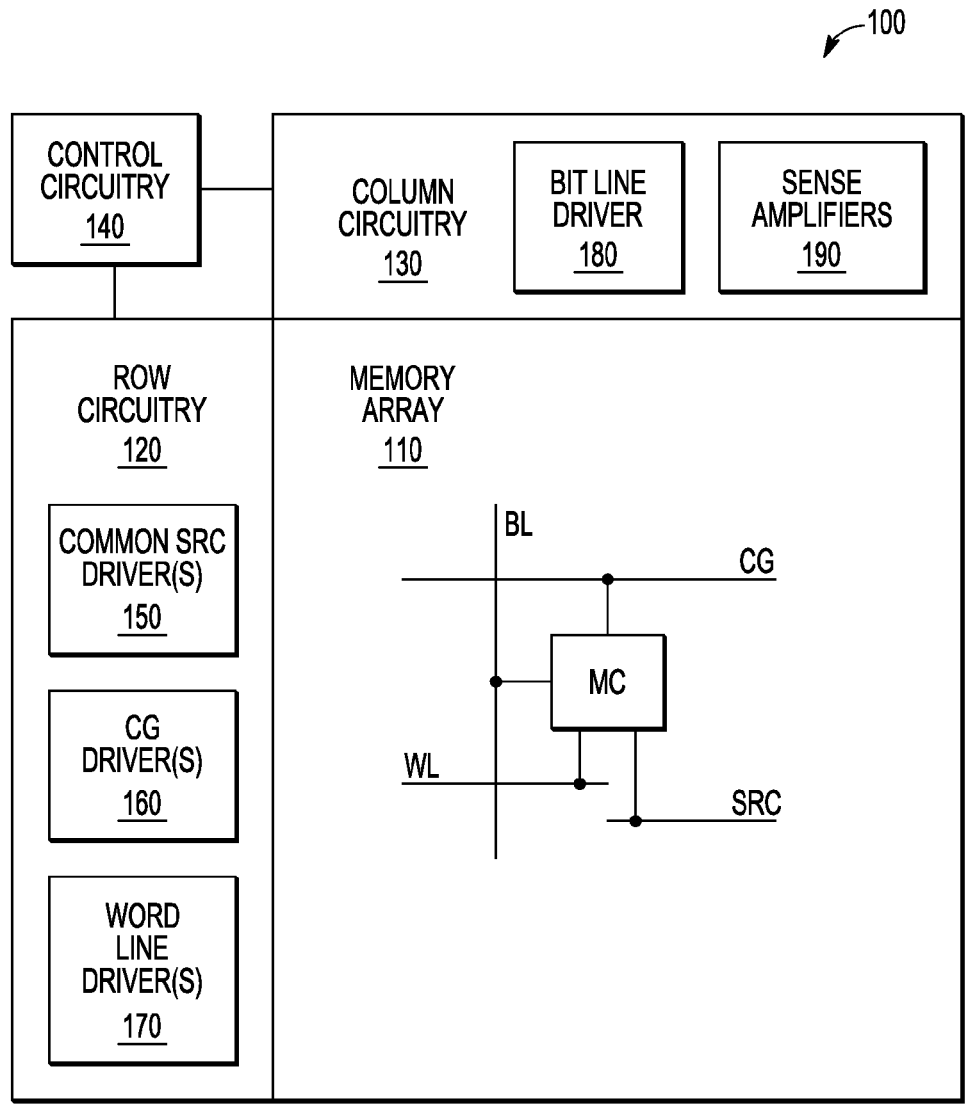
FIG. 1 is a block diagram depicting components of an example memory system in which the present disclosure is implemented, according to some embodiments.

The following sets forth a detailed description of various embodiments intended to be illustrative of the invention and should not be taken to be limiting.

Overview

Presently, thin film storage (TFS) flash memory architecture in a memory device isolates high voltage operations within an active sector of a memory device during program operations in order to minimize program disturb conditions (e.g., minimize any effects on the data stored by surrounding memory cells). An example size of a conventional sector is 8 kB in a memory device that implements a block size of 4096 bytes. Often the maximum voltage supported by a low voltage memory device is less than the voltage needed for high voltage memory operations (e.g., the low voltage memory device may support 9V during a program operation, but does not support 15V during an erase operation). One approach is to utilize a conventional cascode control gate driver to produce the voltage needed for high voltage memory operations. Such a conventional cascode control gate driver includes two p-type metal-oxide-semiconductor (MOS) transistors connected in series between a high voltage terminal and a control gate output that in turn is connected to a number of memory cell control gates within a conventional sector. The conventional cascode control gate driver also includes two n-type MOS transistors connected in series between the control gate output and a low voltage terminal. The control gates of the four transistors are controlled by four independent control signals generated by the conventional cascode control gate driver. However, the circuitry of such a conventional cascode control gate driver must be repeated for every sector (including the logic circuitry to generate the independent control signals), which consumes a significant amount of area of the memory device.

This type of memory architecture further requires that a source line driver be repeated for every sector, which also consumes a significant amount of area of the memory device. Moreover, a source line driver has to drive several milliamps of current during a read operation, which increases the circuitry size of each source line driver to handle such current. Finally, as read widths (or the number of memory cells that are read) increase for high performance, source line driver circuitry area must accordingly increase to drive current for a larger number of memory cells. This means that high voltage memory devices cannot decrease in size, even as memory cell dimension decreases due to advancing technology generations, which makes scaling of high voltage memory devices difficult.

The present disclosure provides for a common source architecture that amortizes source and control gate driver sizes across a larger array pitch. The common source architecture divides a memory array of a memory device into a number of segments called erase sectors (which are much larger than conventional sectors, such as 256 kB) and places a common source (SRC) driver once per erase sector. This reduces the number of SRC drivers implemented in the memory array (due to associating fewer SRC drivers with larger portions of the memory array), which in turn reduces the overall area consumed by the common SRC drivers.

The common source architecture also divides each erase sector into a number of program sectors (which are as large or larger than conventional sectors, such as 8 kB or 32 kB) that are coupled to a control gate (CG) driver. Conventional cascode CG drivers may be utilized in some embodiments of the present disclosure, where each conventional cascode CG driver is coupled to a single program sector. In such embodiments, the number of CG drivers implemented in the memory array is reduced when the program sector size is greater than the conventional sector size (due to associating fewer CG drivers with larger portions of the memory array), which in turn reduces the overall area consumed by the CG drivers. An optimized cascode CG driver is also provided by the present disclosure, where an optimized cascode CG driver is coupled to one or more program sectors within an erase sector. The optimized cascode CG driver minimizes the (repetitive) circuitry placed for every program sector, which reduces the overall area on the memory device consumed by CG driver circuitry. Generally, the common SRC drivers and CG drivers (whether conventional cascode CG drivers or optimized cascode CG drivers) are controlled to select an erase sector for an erase operation and select a program sector for a program operation.

While the common source architecture introduces a new disturb condition during a program operation due to an erase sector being "split" into a selected program sector and a number of unselected program sectors, the architecture minimizes effects of this disturb condition by maintaining a high voltage control gate bias only in a portion of the erase sector (e.g., a program voltage, such as 9V, within the selected program sector) and maintains a low voltage control gate bias in the remaining portion of the erase sector (e.g., a read voltage, such as 1.5V, within the unselected program sectors). Each control gate driver (whether a conventional cascode CG driver coupled to a single program sector or an optimized cascode CG driver coupled to a number of program sectors) is controlled to independently drive a program voltage to a selected program sector and to independently drive a read voltage to unselected program sectors (including unselected program sectors outside of the erase sector that contains the selected program sector) during a program operation. Each control gate driver is also configured to independently drive an erase voltage (e.g., 15V) to all program sectors in a selected erase sector and to independently drive a read voltage (e.g., 1.5V) to all program sectors in unselected erase sectors during an erase operation.

Example Embodiments

FIG. 1 is a block diagram depicting components of an example memory system 100 in which the present disclosure is implemented. Memory system 100 is implemented on a die or semiconductor substrate as part of a memory device. Memory system 100 includes a memory array 110, row circuitry 120, column circuitry 130, and control circuitry 140. Row circuitry 120 includes one or more common source line (SRC) drivers 150, one or more control gate line (CG) drivers 160, and word line driver circuitry 170. Column circuitry 130 includes bit line driver circuitry 180 and sense amplifiers 190. These components are further discussed below.

Memory array 110 is a non-volatile memory (NVM) that includes a plurality of NVM memory cells (also referred to as memory cells) arranged in N rows and M columns, where each memory cell is configured to store a value of data, N and M being integers of one or more. Memory array 110 also includes a number of word lines that each correspond to a row of memory cells in memory array 110, and a number of bit lines that each correspond to a column of memory cells in memory array 110. An example memory cell (MC) of memory array 110 is also illustrated in FIG. 1, where each memory cell of memory array 110 is coupled to a control gate line (CG), a source line (SRC), a word line (WL), and a bit line (BL).

The memory cells of memory array 110 are grouped into a number of program sectors, where each program sector includes a same number of memory cells. In some embodiments, memory array 110 implements a block size of 4096 bytes and a program sector size of a multiple of 8 kB (e.g., 8 kB, 16 kB, 32 kB), although another block size and program sector size may be implemented. The memory cells included in a program sector are each coupled to a common control gate (CG) line. The program sectors are also grouped into a number of erase sectors, where each erase sector includes a set of one or more program sectors. In some embodiments, memory array 110 implements an erase sector size of 256 kB (e.g., each erase sector includes 8 program sectors having a size of 32 kB, or 16 program sectors having a size of 16 kB, or 32 program sectors having a size of 8 kB), although another erase sector size may be implemented up to and including all program sectors of memory array 110. The memory cells in an erase sector are each coupled to a common source (SRC) line. An erase sector is a group of memory cells that are erased during an erase operation, where their control gates are biased at the erase voltage during an erase operation. A program sector is a group of memory cells whose control gates are biased at the program voltage during a program operation. Program sectors and erase sectors are further discussed below in connection with FIG. 6.

Control circuitry 140 is configured to implement a memory operation, such as a read, program, or erase operation, by controlling row circuitry 120 and column circuitry 130 to apply predetermined voltages to control gate lines, source lines, word lines, and bit lines of the memory cells of memory array 110. As provided herein, control circuitry 140 is further configured to control common SRC driver(s) 150 and CG driver(s) 160 to implement a sector selection scheme during a program operation and an erase operation. Sector selection schemes are further discussed below in connection with FIGS. 7 and 8.

A driver circuit, such as common SRC driver 150 and CG driver 160, drives or provides a voltage to a coupled memory cell line during a memory operation, such as a read, program, or erase operation. Each common SRC driver 150 is coupled to a single common source line of an erase sector and is configured to apply a predetermined voltage to the corresponding common source line, based on information (e.g., control signals and address information) received from control circuitry 140. In some embodiments, CG driver 160 is an optimized cascode CG driver (also referred to as simply an optimized CG driver) that is coupled to each common control gate line of a set of program sectors that are included in an erase sector. Optimized cascode CG driver 160 is configured to apply one or more predetermined voltages to the common control gate lines of the set of program sectors, as controlled by logic of the CG driver 160 based on information (e.g., control signals and address information) received from control circuitry 140. In other embodiments, CG driver 160 is a conventional cascode CG driver (also referred to as simply a conventional CG driver) that is coupled to a common control gate line of a single program sector. Each conventional cascode CG driver is configured to apply one or more predetermined voltages to the common control gate line of the program sector, based on information (e.g., control signals and address information) received from control circuitry 140. Common SRC driver(s) 150 and optimized CG driver 160 are further discussed below in connection with FIGS. 2 and 3. An optimized CG driver 160 (including CG driver logic) is further discussed below in connection with FIGS. 4 and 5. Predetermined voltages for program and erase operations are further discussed below in connection with FIG. 9.

Word line driver circuitry 170 is coupled to the word lines of memory array 110 and is configured to activate one or more word lines (e.g., drive to a logic high level) in order to select one or more rows of memory cells, as instructed by control circuitry 140. Bit line driver circuitry 180 is coupled to the bit lines of memory array 110 and is configured to drive one or more bit lines in order to program or erase data of selected memory cells, as instructed by control circuitry 140. Sense amplifiers 190 are coupled to the bit lines of memory array 110 and are configured to read memory cell data of the selected memory cells, as instructed by control circuitry 140.

Figure 6:
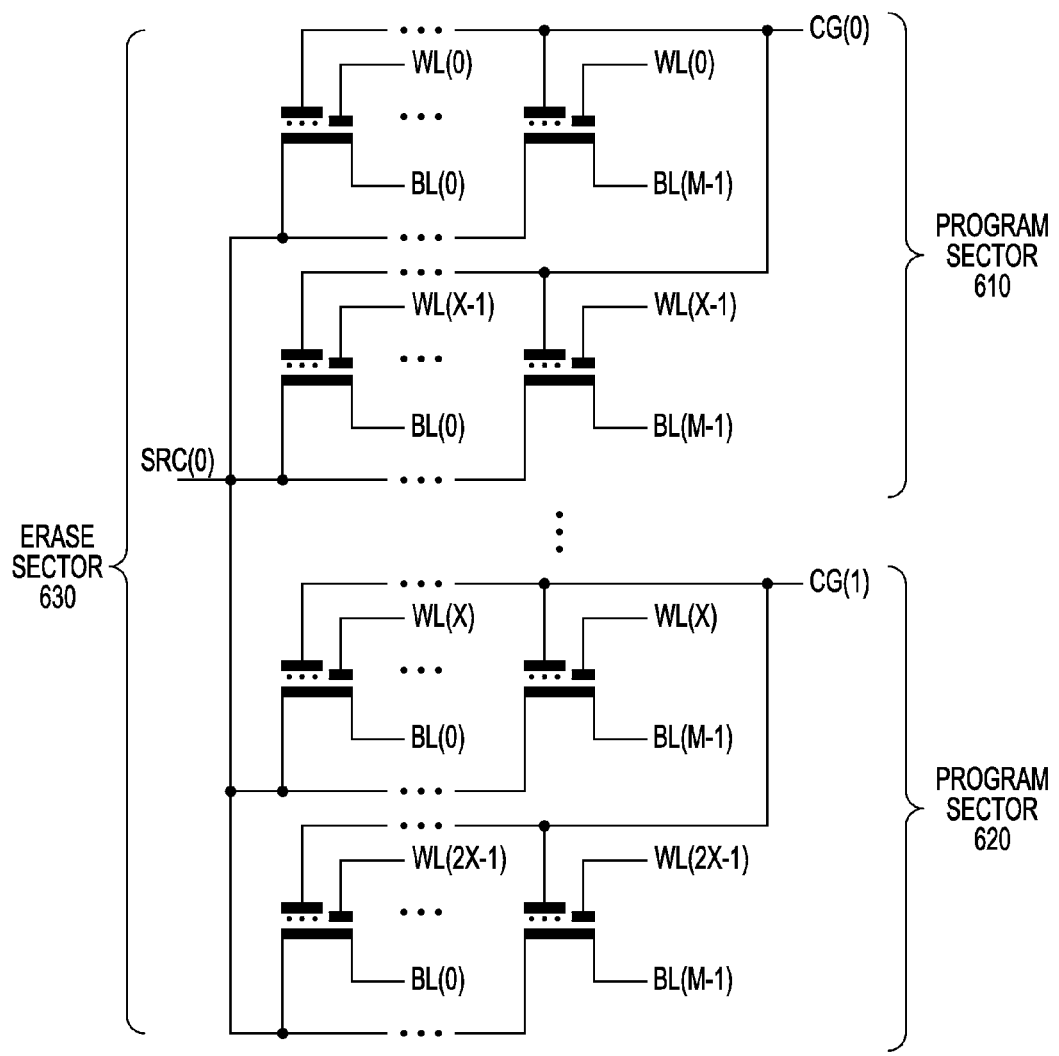
FIG. 6 is a block diagram depicting a portion of a memory array that implements an example erase sector and example program sectors in which the present disclosure is implemented, according to some embodiments.

FIG. 6 is a block diagram depicting a portion of memory array 110 that implements an example erase sector 630 and example program sectors 610 and 620. The memory cells of memory array 110 are grouped into a number of program sectors, such as program sectors 610 and 620. Each program sector includes a same number of memory cells. A program sector has a width of up to the width of the memory array (e.g., each program sector has a maximum width of M memory cells, or the number of memory cells in a full row of the memory array). The program sectors are also grouped into a super set called an erase sector, where each erase sector includes an S number of program sectors, S being an integer of one or more. In the embodiment illustrated in FIG. 6, erase sector 630 and program sectors 610 and 620 have a width equal to a full row of memory cells, or M memory cells. Each program sector also has an X number of memory cell rows, X being an integer of one or more.

For the embodiment depicted in FIG. 6, the memory cells included in memory array 110 are split-gate type NVM memory cells. Each split-gate memory cell has two current electrodes, such as a source electrode and a drain electrode, as well as a select gate electrode and a control gate electrode. Depending upon the operation (e.g., read operation, program operation, erase operation) to be performed on the memory cells, different bias voltages are respectively applied to the source, drain, control gate, and select gate electrodes for selected ones of the memory cells.

The source electrodes of the memory cells in an erase sector are coupled to a common source line SRC. As illustrated in FIG. 6, the source electrodes of the memory cells in erase sector 630 are tied to a common source line SRC(0). The drain electrodes of each column of memory cells are coupled to a respective one of bit lines BL(0)-(M−1). The select gate electrodes of each row of memory cells are coupled to a respective one of word lines WL(0)-(N−1), where N is the number of rows in the memory array. As illustrated in FIG. 6, since each program sector includes an X number of memory cell rows, the select gate electrodes of each memory cell row in program sector 610 are illustrated as being coupled to a respective one of word lines WL(0)-(X−1), and the select gate electrodes of each memory cell row in program sector 620 are illustrated as being coupled to a respective one of word lines WL(X)-(2X−1).

The control gate electrodes of the memory cells in a program sector are coupled to a respective one of control gate lines CG(0)-(S−1), where S is the number of program sectors in each erase sector. As illustrated in FIG. 6, the control gate electrodes of the memory cells in program sector 610 are tied to a common control gate line CG(0) and the control gate electrodes of the memory cells in program sector 620 are tied to a common control gate line CG(1). Accordingly, two memory cells in a same erase sector but in different program sectors have their control gate electrodes coupled to different CG lines (e.g., CG(0) and CG(1)), but have their source electrodes coupled to the same common SRC line (e.g., SRC(0)).

For some split-gate type NVM memory cell embodiments, a control gate, a dielectric layer, a trapped charge layer, and a tunnel dielectric layer will typically be located below the control gate electrode and above the channel region within the semiconductor substrate upon which the split-gate memory cell is fabricated. It is noted that other NVM memory cell types could also be utilized, such as floating-gate NVM memory cells, multi-level NVM memory cells, and/or other types of NVM memory cells, if desired. It is also noted that memory array 110 can be integrated within a single integrated circuit with one or more processors, can be implemented as a stand-alone memory integrated circuit, or can be implemented in another desired configuration, as desired.

Figure 2:
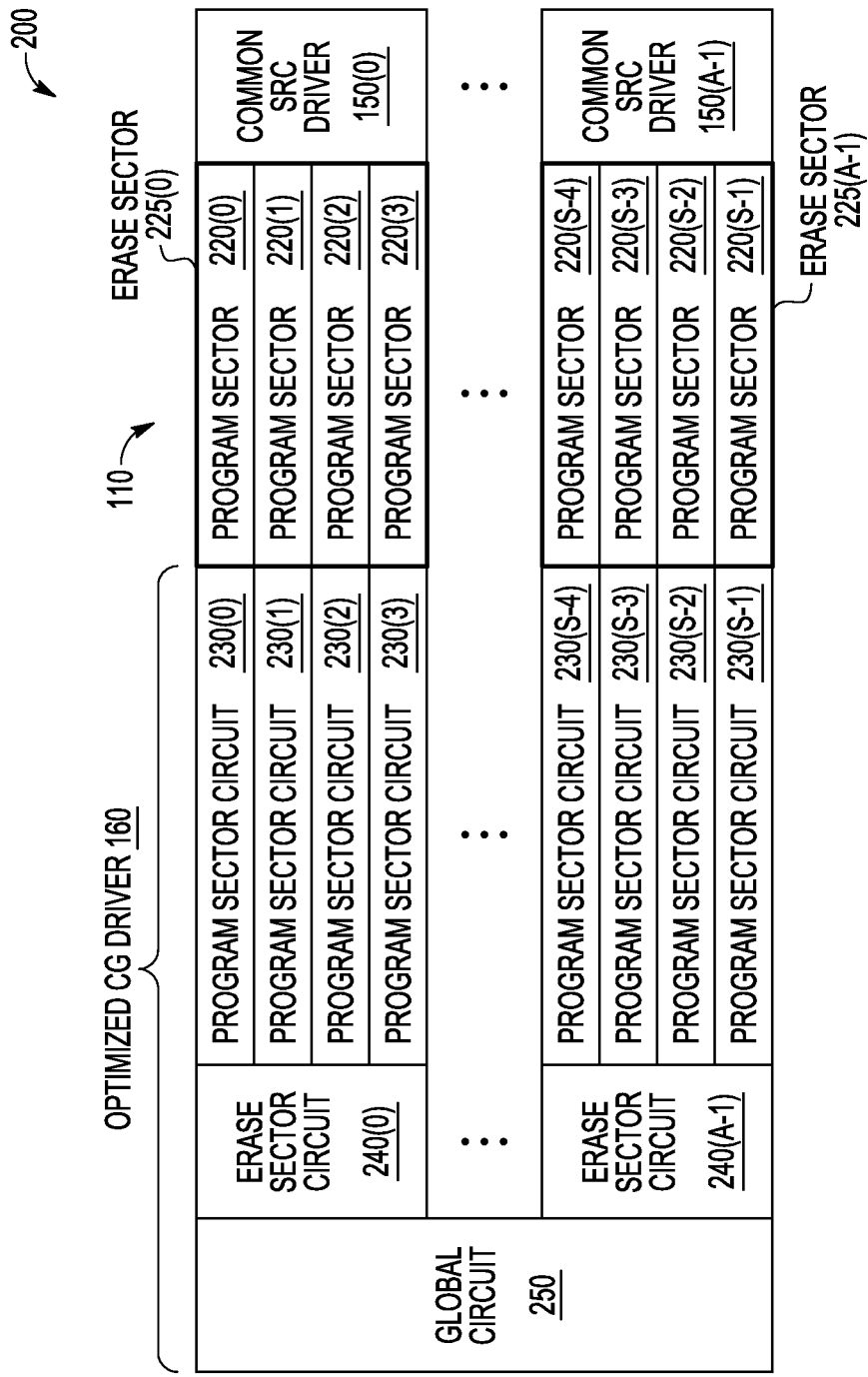
FIGS. 2 and 3 are block diagrams depicting an example memory array having an example common source driver and an example optimized control gate driver in which the present disclosure is implemented, according to some embodiments.

FIG. 2 is a block diagram depicting an example memory system 200 having a memory array 110 and row circuitry 120 that includes a number of common source (SRC) drivers 150(0)-(A−1) and an optimized cascode control gate (CG) driver 160, where A is the number of erase sectors 225 in memory array 110. Each erase sector 225 is associated with a common SRC driver 150. Memory cells of memory array 110 are grouped into a plurality of program sectors 220, and an S number of program sectors are grouped into each erase sector 225. In the embodiment illustrated in FIG. 2, S is equal to 4, where each erase sector includes 4 program sectors.

The memory cells in a given erase sector each have a source electrode tied to a common SRC line, which is coupled to an output of the associated common SRC driver 150. For example, erase sector 225(0) includes program sectors 220(0)-(3) and the source electrodes of memory cells in program sectors 220(0)-(3) are tied to a common SRC line that is coupled to an output of common SRC driver 150(0), where common SRC driver 150(0) is associated with erase sector 225(0). Erase sector 225(A−1) includes program sectors 220(S−4)-(S−1) and the source electrodes of memory cells in program sectors 220(S−4)-(S−1) are tied to another common SRC line that is coupled to an output of common SRC driver 150(A−1), where common SRC driver 150(A−1) is associated with erase sector 225(A−1). Each common SRC driver 150 is configured to drive its associated common SRC line with a source signal of appropriate voltage for program and erase operations, based on information received from control circuitry 140.

In the embodiment shown in FIG. 2, circuitry of optimized CG driver 160 includes CG driver global circuit 250, CG driver erase sector circuits 240(0)-(A−1), and CG driver program sector circuits 230(0)-(S−1). CG driver global circuit 250 is coupled to an A number of erase sector circuits 240, and each erase sector circuit 240 is coupled to an S number of program sector circuits 230, where optimized CG driver 160 includes an A×S number of program sector circuits 230. Each program sector circuit 230 corresponds to a respective program sector 220, and each erase sector circuit 240 corresponds to a respective erase sector 225.

The memory cells in a given program sector 220 each have a control gate electrode tied to a common CG line, which is coupled to an output of a corresponding program sector circuit 230. For example, the control gate electrodes of memory cells in program sector 220(0) of erase sector 225(0) are tied to a common CG line coupled to an output of program sector circuit 230(0), where program sector circuit 230(0) is coupled with erase sector circuit 240(0) that is associated with erase sector 225(0). The control gate electrodes of memory cells in program sector 220(1) are tied to an output of program sector circuit 230(1), and so on for program sectors 220(2) and (3). Similarly, the control gate electrodes of memory cells in program sector 220(S−4) of erase sector 225(A−1) are tied to a common CG line that is coupled to an output of program sector circuit 230(S−4), which is coupled with erase sector circuit 240(A−1) that is associated with erase sector 225(A−1). The control gate electrodes of memory cells in program sector 220(S−3) are tied to an output of program sector circuit 230(S−3), and so on for program sectors 220(S−2) and 220(S−1).

CG driver global circuit 250 includes supply voltage circuitry that is configured to provide a high voltage (Vhv), an intermediate voltage (Vmv), and a protection voltage (Vprot) for use by erase sector circuits 240(0)-(A−1). The supply voltage circuitry is also configured to provide a high voltage supply rail and a low voltage supply rail that are coupled to each of program sector circuits 230(0)-(S−1). In other embodiments, global circuit 250 optionally includes an address predecoder, a voltage level shifter, or both. CG driver global circuit 250 is further discussed below in connection with FIG. 4.

Each CG driver erase sector circuit 240 includes CG driver logic that is configured to independently drive a respective control signal to each coupled program sector circuit 230, based on the memory operation being implemented. As indicated by the respective control signal, each program sector circuit 230 is configured to utilize either the high voltage supply rail or the low voltage supply rail to drive the respective common CG line with a control gate signal of appropriate voltage during program and erase operations.

Each CG driver erase sector circuit 240 is also configured to bias the respective control signals differently for program and erase operations to ensure safe operation of the circuitry (e.g., transistors) of each program sector circuit 230. For example, during an erase operation, erase sector circuit 240 biases control signals of each program sector circuit 230(0)-(S−1) with the intermediate voltage Vmv, which acts as a cascode protection voltage to ensure that any voltage differential across the circuitry does not exceed safe operating limits (e.g., to ensure that the voltage differentials experienced by the transistors remain within the limits of the transistors to avoid breakdown). Similarly, erase sector circuit 240 utilizes the protection voltage Vprot to bias the circuitry within CG driver logic during an erase operation and ensure that any voltage differential does not exceed safe operating limits. Optimized CG drivers 160 are further discussed below in connection with FIGS. 4 and 5.

In other embodiments (not shown), the optimized CG driver 160 is replaced with conventional CG drivers. In such embodiments, using the example memory system 200 illustrated in FIG. 2, CG driver global circuit 250 and CG driver erase sector circuits 240(0)-(A−1) are eliminated and each CG driver program sector circuit 230 is replaced with a conventional CG driver, where each conventional CG driver has an output coupled to a common CG line of a single corresponding program sector 220. Each conventional CG driver includes logic and other component circuitry, such as a voltage level shifter and supply voltage circuitry, which are configured to drive the common CG line with a control gate signal of appropriate voltage for program and erase operations, based on information received from control circuitry 140.

Figure 3:
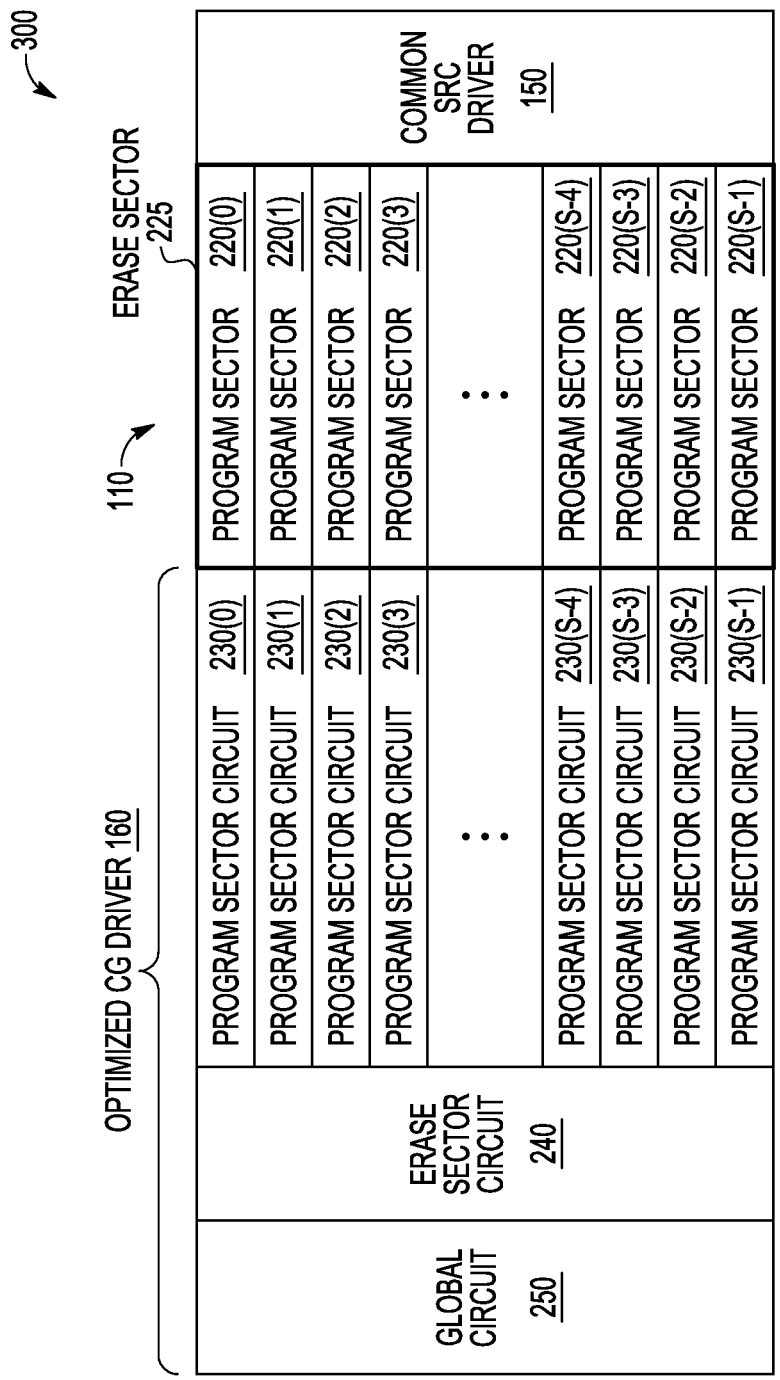

FIG. 3 is another block diagram depicting another example memory system 300 having a memory array 110 and row circuitry 120 that includes a single common source driver 150 and an optimized control gate driver 160. Common source driver 150 and optimized control gate driver 160 (including global circuit 250, erase sector circuit 240, and program sector circuits 230) operate as described above in connection with FIG. 2. In the embodiment illustrated in FIG. 3, S is equal to all program sectors available in memory array 110, indicating a single erase sector 225 is implemented. As illustrated in FIG. 3, erase sector 225 includes program sectors 220(0)-(S−1). Erase sector 225 is associated with common SRC driver 150 and optimized CG driver 160.

The memory cells in erase sector 225 each have a source electrode tied to an output of common SRC driver 150, which is configured to drive its output with a source signal of appropriate voltage for program and erase operations, based on information received from control circuitry 140. The memory cells a given program sector 220 each have a control gate electrode tied to an output of program sector circuit 230. For example, the memory cells in program sector 220(0) each have a control gate electrode tied to an output of program sector circuit 230, the memory cells in program sector 220(1) each have a control gate electrode tied to an output of program sector circuit 230(1), and so on for each program sector in erase sector 225. Each program sector circuit 230 is coupled to a respective control signal output of CG driver erase sector circuit 240, which drives a respective control signal to each coupled program sector circuit 230, based on the memory operation being implemented. Each program sector circuit 230 is configured to utilize either the high voltage supply rail or the low voltage supply rail provided by global circuit 250 to drive a respective common CG line with a control gate signal of appropriate voltage during program and erase operations, as indicated by the respective control signal.

In other embodiments (not shown), the optimized CG driver 160 is replaced with conventional control gate drivers. In such embodiments, using the example memory system 300 illustrated in FIG. 3, CG driver global circuit 250 and CG driver erase sector circuit 240 are eliminated and each CG driver program sector circuit 230 is replaced with a conventional CG driver, where each conventional CG driver has an output coupled to a common CG line of a single corresponding program sector 220. Each conventional CG driver includes logic and other component circuitry, such as a voltage level shifter and supply voltage circuitry, which are configured to drive the common CG line with a control gate signal of appropriate voltage for program and erase operations, based on information received from control circuitry 140.

Figure 4:
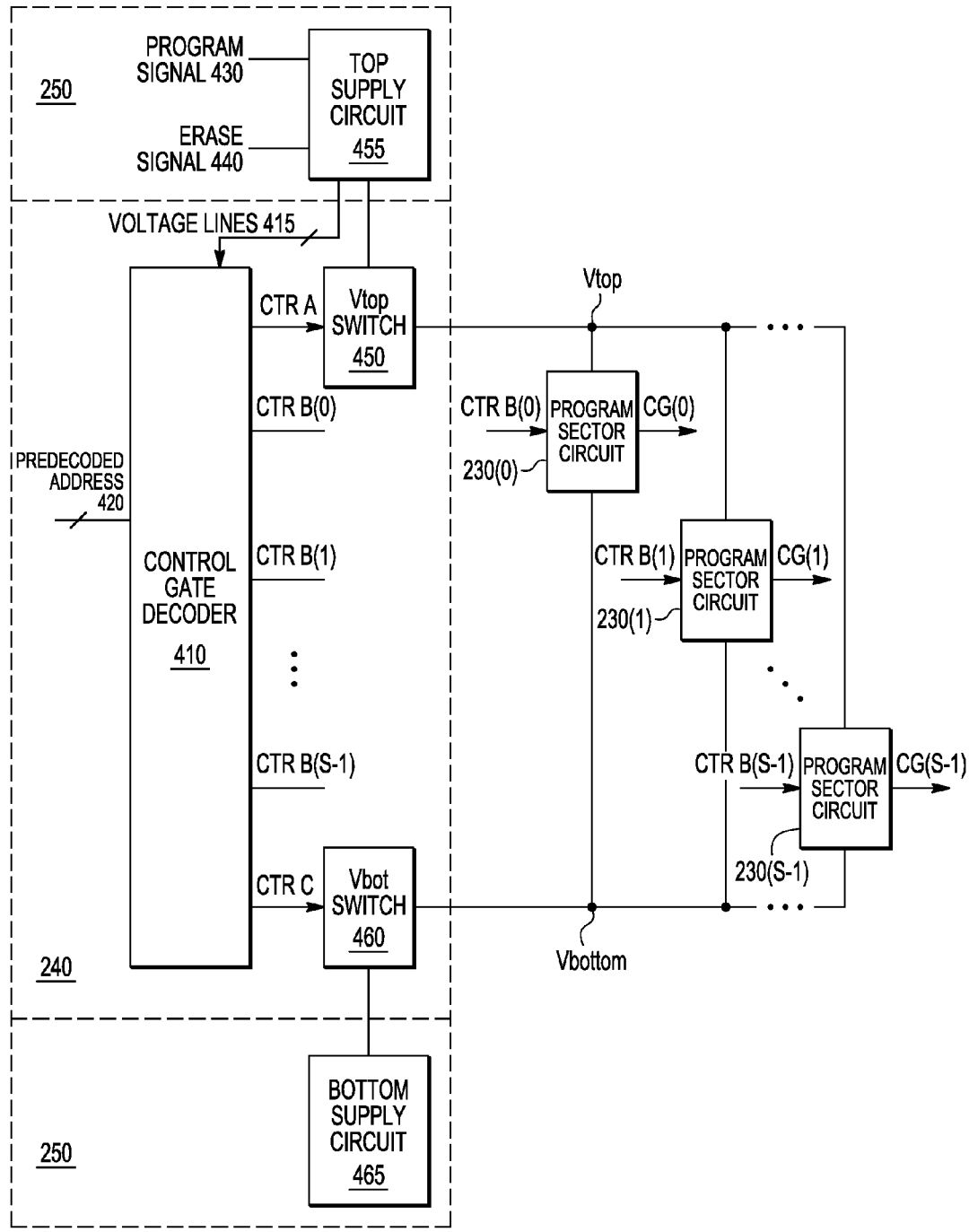
FIGS. 4 and 5 are block diagrams depicting components of an example optimized control gate driver in which the present disclosure is implemented, according to some embodiments.

FIG. 4 is a block diagram depicting components of an example optimized control gate driver 160 that is associated with a single erase sector. Circuitry of optimized CG driver 160 includes global circuit 250, erase sector circuit 240, and an S number of program sector circuits 230(0)-(S−1). CG driver 160 is associated with an erase sector, and each program sector circuit 230 of CG driver 160 is associated with a corresponding program sector within the erase sector. Global circuit 250 includes a top supply circuit 455 and a bottom supply circuit 465. Erase sector circuit 240 includes a control gate decoder 410, a top voltage (Vtop) switch 450, and a bottom voltage (Vbot) switch 460, as further discussed below.

Control gate decoder 410 includes CG driver logic that is configured to generate a number of control signals CTR A, CTR B(0)-(S−1), and CTR C based on the memory operation being performed. In the embodiment illustrated, control gate decoder 410 is configured to receive predecoded address signals 420 from an address predecoder (not shown). In some embodiments, the address predecoder is part of global circuit 250. The address predecoder is configured to receive an address, a program signal 430, and an erase signal 440 from control circuitry 140. The address indicates an address of a program sector within memory array 110 that is selected for a memory operation. Program signal 430 indicates whether a program operation is being performed on the selected program sector. Erase signal 440 indicates whether an erase operation is being performed on the selected erase sector (e.g., the address indicates an address of a starting program sector of the erase sector).

The address predecoder is configured to predecode the address, program signal 430, and erase signal 440 into a number of predecoded address signals 420 that correspond to one or more program sectors (e.g., a single program sector or all program sectors of an erase sector) associated with control gate decoder 410 that are selected for a memory operation, such as a program or erase operation. Values of the predecoded address signals 420 indicate whether a program or erase operation is being performed on the one or more program sectors. CG driver logic of control gate decoder 410 is configured to utilize the predecoded address signals 420 to generate the control signals CTR A, CTR B(0)-(S−1), and CTR C to implement the memory operation on the one or more selected program sectors, as further discussed below.

A subset of predecoded address signals 420 is provided to a voltage level shifter (not shown) that is configured to shift or convert the voltage level of the subset of predecoded address signals 420 to a higher voltage level (also referred to as level-shifted predecoded address signals). The level-shifted predecoded address signals are also provided to control gate decoder 410 as part of predecoded address signals 420. The level-shifted predecoded address signals are used by control gate decoder 410 to bias control signals differently for program and erase operations to ensure safe operation of the circuitry of each component (e.g., transistors) that receives the control signals. During a program operation, the control signals CTR A, CTR B(0)-(S−1), and CTR C are low voltage signals that are driven using the voltages available on a low voltage memory device (e.g., the memory device is configured to support voltages 0V to 9V). During an erase operation, the voltage level shifter outputs level-shifted predecoded address signals that are utilized by control gate decoder 410 to output one or more of control signals CTR A, CTR B(0)-(S−1), and CTR C as high voltage signals (also referred to as level-shifted signals), to ensure that any voltage differential across switches 450 and 465 and program sector circuits 230(0)-(S−1) does not exceed safe operating limits as they are exposed to the high voltage of the erase operation. Control signals CTR A, CTR B(0)-(S−1), and CTR C are further discussed below.

In some embodiments, the control gate decoder 410 of optimized CG driver 160 also includes the address predecoder. In other embodiments, the control gate decoder 410 of optimized CG driver 160 also includes the voltage level shifter. In still other embodiments, the control gate decoder 410 of optimized CG driver 160 includes both the address predecoder and the voltage level shifter. It is noted that a preferred embodiment of optimized CG driver 160 (as illustrated in FIG. 4) does not include the address predecoder or the voltage level shifter in order to minimize the CG driver circuitry repeated for each erase sector, instead receiving predecoded address signals 420 (including level-shifted predecoded address signals) as described above.

In some embodiments, CG driver logic of control gate decoder 410 utilizes NAND logic implementation (e.g., NAND logic gates implemented utilizing MOS transistors) that generate control signals CTR A, CTR B(0)-(S−1), and CTR C, although other logic implementations may be utilized in other embodiments. A NAND logic implementation of CG driver logic is discussed below.

Control gate decoder 410 is configured to output a control signal CTR C that is coupled to a control gate of Vbot switch 460. One electrode of Vbot switch 460 is coupled to bottom supply circuit 465 and another electrode of Vbot switch 460 is coupled to a Vbottom node. Bottom supply circuit 465 is configured to supply a bottom power supply voltage, which is provided to Vbottom node when CTR C signal activates Vbot switch 460. In one embodiment, control gate decoder 410 generates CTR C by a NAND gate having two inputs respectively coupled to two non-shifted pre-decoded address signals corresponding to the erase sector associated with control gate decoder 410, where high and low voltage rails of the NAND gate are coupled to Vmv and Vss, respectively. The values of the two non-shifted pre-decoded address signals indicate whether the erase sector is selected for an erase operation or whether a program sector within the erase sector is selected for a program operation. For example, if at least one input is logic low, the NAND gate outputs a logic high CTRC that turns on Vbot switch 460, indicating that one of a program operation or an erase operation is being performed within the erase sector.

Control gate decoder 410 is configured to output a control signal CTR A that is coupled to a control gate of Vtop switch 450. One electrode of Vtop switch 450 is coupled to top supply circuit 455 and another electrode of Vtop switch 450 is coupled to a Vtop node. Top supply circuit 455 is configured to supply a top power supply voltage, which is provided to Vtop node when CTR A activates Vtop switch 450. In one embodiment, control gate decoder 410 generates CTR A by a NAND gate having two inputs respectively coupled to two level-shifted predecoded address signals corresponding to the erase sector associated with control gate decoder 410, where high and low voltage rails of the NAND gate are coupled to Vhv and Vprot, respectively. The two level-shifted predecoded address signals utilized to generate CTR A are respective level-shifted versions of the non-shifted predecoded address signals utilized to generate CTR C. The values of the two level-shifted predecoded address signals indicate whether the erase sector is selected for an erase operation or whether a program sector within the erase sector is selected for a program operation. For example, if both inputs are logic high, the NAND gate outputs a logic low CTR A that turns on Vtop switch 450, indicating that one of a program operation or an erase operation is being performed within the erase sector.

Top supply circuit 455 includes selection circuitry, such as a multiplexer, that selects from among a number of predetermined voltages based on the memory operation being performed. Top supply circuit 455 receives program signal 430 and erase signal 440 and selects a high voltage (Vhv) based on whether program signal 430 or erase signal 440 is activated. The selection circuitry of top supply circuit 455 selects a program voltage (e.g., 9V) as Vhv in response to a program operation (e.g., in response an activated program signal 430) and selects an erase voltage (e.g., 15V) as Vhv in response to an erase operation (e.g., in response to an activated erase signal 440). The selection circuitry of top supply circuit 455 also selects a read voltage (e.g., 6V) as Vhv in response to a read operation. Top supply circuit 455 then outputs the selected Vhv as a top power supply voltage to Vtop switch 450.

The selection circuitry of top supply circuit 455 also selects a protection voltage Vprot based on the memory operation being performed. Top supply circuit 455 selects Vss (e.g., 0V) in response to a program operation (as well as in response to a read operation), and selects an intermediate voltage Vmv (e.g., a voltage in a range of 5V to 6V) in response to an erase operation. Top supply circuit 455 also outputs the selected Vhv, and the selected Vprot, and the intermediate voltage Vmv to control gate decoder 410 via voltage lines 415.

Bottom supply circuit 465 also includes selection circuitry, such as a multiplexer, that selects from among a number of predetermined voltages based on the memory operation being performed. The selection circuitry of bottom supply circuit 465 selects a read voltage (e.g., 1.5V) in response to program and erase operations being performed (e.g., provides the read voltage by default). In some embodiments, the selection circuitry of bottom supply circuit 465 selects Vss (e.g., 0V), or other appropriate voltage such as intermediate voltage Vmv for other memory operations (e.g., a read operation), where bottom supply circuit 465 receives other signals from control circuitry 140 (e.g., a signal indicating a read operation). Bottom supply circuit 465 then outputs the selected voltage as a bottom power supply voltage.

Control gate decoder 410 is also configured to output an S number of control signals CTR B(0)-(S−1) that are each coupled to a respective one of program sector circuits 230(0)-(S−1). Each program sector circuit 230 is coupled to a respective control gate (CG) line of a corresponding program sector 220. Each program sector circuit 230 is controlled by control gate decoder 410, based on a respective one of control signals CTR B(0)-(S−1), to drive the corresponding control gates of the memory cells that are coupled to the respective CG line. Each program sector circuit 230 is also coupled to a high voltage supply rail provided by Vtop node and a low voltage supply rail provided by Vbottom node.

In one embodiment, each control signal of CTR B(0)-(S−1) is generated by a respective one of an S number of NAND gates. Each of the S number of NAND gates has three inputs respectively coupled to three level-shifted pre-decoded address signals corresponding to one or more program sectors within the erase sector associated with control gate decoder 410. High and low voltage rails of all S number of NAND gates are coupled to Vhv and Vprot, respectively. All S number of NAND gates include two inputs coupled to two level-shifted predecoded address signals that correspond to the erase sector. Each of the S number of NAND gates has a third input that is a level-shifted predecoded address signal corresponding to a respective one of the program sectors within the erase sector. In other words, each program sector circuit 230 is associated with a given program sector, where the program sector circuit 230 receives a control signal from a NAND gate that has an input that corresponds to the given program sector. The values of the three level-shifted predecoded address signals indicate whether a respective one of the program sectors is selected for a program operation, or whether all program sectors of the erase sector are selected for an erase operation. For example, a single NAND gate for a particular program sector may output a logic low while the remaining S number of NAND gates output a logic high, indicating that a program operation is being performed on the particular program sector. If all S number of NAND gates output a same logic low, an erase operation is being performed on all program sectors of the erase sector.

To implement an erase operation for a targeted erase sector, control circuitry 140 communicates an activated erase signal 440 to each top supply circuit 455 in the memory system. In response to receipt of activated erase signal 440 and address 420, each top supply circuit 455 selects the erase voltage to be Vhv (e.g., 15V), selects 6V to be Vmv, and selects Vmv (e.g., 6V) to be Vprot. Bottom supply circuit 465 outputs the read voltage (e.g., 1.5V).

Each control gate decoder 410 receives predecoded address signals 420. One particular control gate decoder 410 receives a set of predecoded address signals 420 that indicate an erase operation is being performed on a targeted erase sector associated with the particular control gate decoder 410. In response, the particular control gate decoder 410 drives control signal CTR A with Vmv (e.g., serves as logic low) to Vtop switch 450 to close the connection and provide the erase voltage to Vtop node. The particular decoder 410 also drives control signal CTR C with Vss (e.g., 0V that serves as logic low) to Vbot switch 460 to open the connection and disconnect bottom supply circuit 460 from Vbottom node (where bottom supply circuit 465 continues to supply a read voltage). In response to the activated erase signal 440, the particular decoder 410 also drives control signals B(0)-(S−1) with Vmv (e.g., serves as both logic low and logic high, as further discussed below in connection with FIG. 5) to control all coupled program sector circuits 230 to close both connections to Vtop node and Vbottom node. Since Vtop node carries the erase voltage and Vbottom node is disconnected from any voltage, all program sector circuits 230 drive their CG lines with Vtop, or the erase voltage. Vmv also acts as a cascode protection voltage for the circuitry of each program sector circuit 230(0)-(S−1) during the high voltage erase operation, ensuring that any voltage differential across the circuitry does not exceed safe operating limits. As a result, all program sectors of the targeted (or selected) erase sector are selected for the erase operation.

During the erase operation, the remaining control gate decoders 410 of CG drivers 160 each receive a set of predecoded address signals 420 that indicate they are not associated with the targeted erase sector (e.g., the remaining decoders 410 are associated with the unselected erase sectors). In response, each remaining decoder 410 drives control signal CTR A with the erase voltage (e.g., serves as logic high) to Vtop switch 450 to open the connection and disconnect the top supply circuit 455 from Vtop node (where top supply circuit 455 continues to supply the erase voltage). Each remaining control gate decoder 410 also drives control signal CTR C with Vmv (e.g., serves as logic high) to Vbot switch 460 to close the connection and provide the read voltage to Vbottom node. Based on the activated erase signal 440, each remaining control gate decoder 410 also drives control signals B(0)-(S−1) with Vmv (e.g., serves as both logic low and logic high, as further discussed below in connection with FIG. 5) to control all coupled program sector circuits 230 to close both connections to Vtop node and Vbottom node. Since Vtop node is disconnected from any voltage and Vbottom node carries the read voltage, all program sector circuits 230 drive their CG lines with Vbottom, or the read voltage. As a result, all program sectors within each unselected erase sector are unselected for the erase operation.

To implement a program operation, control circuitry 140 communicates an activated program signal 430 to each top supply circuit 455 in the memory system. In response to receipt of activated program signal 430, each top supply circuit 455 selects the program voltage to be Vhv (e.g., 9V), selects 5V to be Vmv, and selects Vss to be Vprot (e.g., 0V). Bottom supply circuit 465 outputs the read voltage.

Each control gate decoder 410 receives predecoded address signals 420. One particular control gate decoder 410 receives a set of predecoded address signals that indicate a program operation is being performed on a targeted program sector within the erase sector that is associated with the particular decoder 410. In response, the particular control gate decoder 410 drives control signal A with Vss (e.g., 0V that serves as logic low) to Vtop switch 450 to close the connection and provide the program voltage to Vtop node.

The particular decoder 410 also drives control signal CTR C with Vmv (e.g., serves as logic high) to Vbot switch 460 to close the connection and provide the read voltage to Vbottom node.

The particular decoder 410 also drives a control signal B(X) with Vss (e.g., 0V that serves as logic low) to the program sector circuit 230 that is coupled to the targeted program sector as indicated by predecoded address signals 420. Control signal B(X) controls the program sector circuit 230 to close the connection to Vtop node and to drive its CG line with Vtop, or the program voltage. The particular decoder 410 also drives the remaining control signals B(0)-(S−1), excluding B(X), with the program voltage (e.g., serves as logic high) to control the remaining program sector circuits to close the connection to Vbottom node and to drive their CG lines with Vbottom, or the read voltage. As a result, the particular program sector is selected for the program operation (e.g., has a CG line driven with the program voltage), while the remaining program sectors are not selected (e.g., each has a CG line driven with the read voltage).

During the program operation, the remaining control gate decoders 410 each receive a set of predecoded address signals 420 that indicate they are not associated with the targeted program sector (e.g., decoders 410 that are associated with the unselected erase sectors). In response, the remaining decoders 410 drive control signal A with Vss (e.g., 0V that serves as logic low) to Vtop switch 450 to close the connection and provide the program voltage to Vtop node. The remaining decoders 410 also drive control signal CTR C with Vmv (e.g., serves as logic high) to Vbot switch 460 to close the connection and provide the read voltage to Vbottom node. The remaining decoders 410 also each drive their control signals B(0)-(S−1) with the program voltage (e.g., a high voltage level of 9V that serves as logic high) to control the program sector circuits to close the connection to Vbottom node and to drive their CG lines with Vbottom, or the read voltage. As a result, all program sectors within each unselected erase sector are unselected for the program operation.

Figure 5:
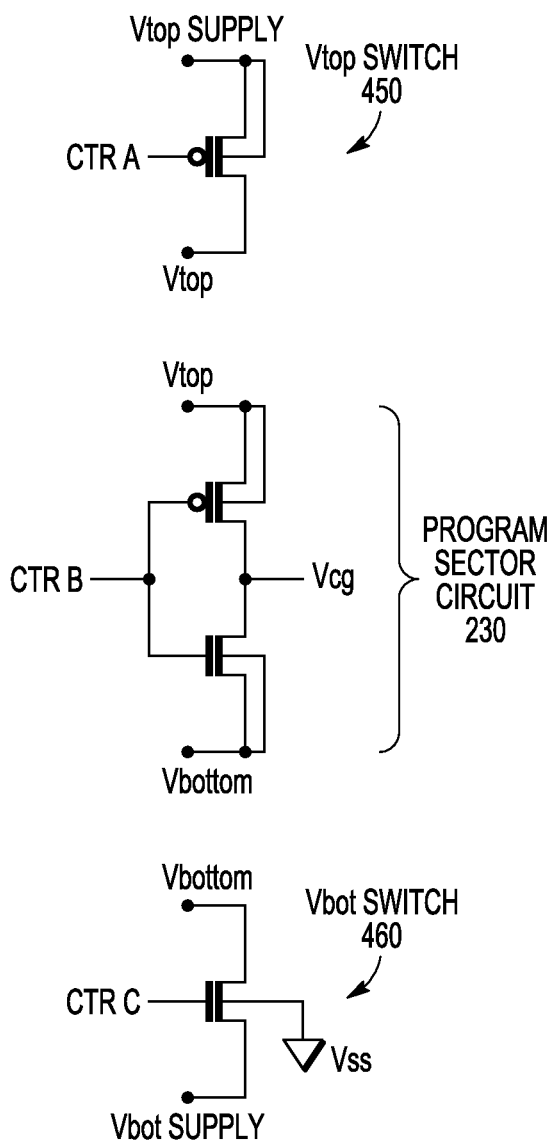

FIG. 5 is a block diagram depicting example circuitry implemented in an optimized control gate driver 160 in which the present disclosure is implemented. An example Vtop switch 450 is illustrated at the top of the figure, an example program sector circuit 230 is illustrated in the middle of the figure, and an example Vbot switch 460 is illustrated at the bottom of the figure.

Vtop switch 450 includes a switching mechanism, such as a p-type transistor or other suitable structure, which receives control signal CTR A at a gate electrode. In the embodiment illustrated in FIG. 5, one current electrode and a body electrode of Vtop switch 450 are coupled to a top power supply voltage (Vtop supply), where Vtop supply is provided by top supply circuit 455 based on the memory operation being implemented. Another current electrode of Vtop switch is coupled to Vtop node, where Vtop node provides a high voltage supply rail utilized by program sector circuits 230. In the embodiment illustrated in FIG. 5, control signal CTR A is active-low, indicating that the Vtop switch connection is closed when CTR A is a logic low voltage level and is open when CTR A is a logic high voltage level.

During a program operation (regardless of whether CG driver 160 is associated with an erase sector that includes selected program sector or with an unselected erase sector), CTR A is a low voltage (non-shifted) signal biased at a low voltage level (e.g., Vss or 0V), which serves as logic low and closes Vtop switch 450 and connects top supply circuit 455 to Vtop node to receive a program voltage (e.g., 9V).

During an erase operation where CG driver 160 is associated with a selected erase sector, CTR A is a level-shifted signal biased at an intermediate voltage level (e.g., level-shifted Vmv, such as 6V), which serves as logic low and closes Vtop switch 450 and connects top supply circuit 455 to Vtop node to receive an erase voltage (e.g., 15V). During an erase operation where CG driver 160 is associated with an unselected erase sector, CTR A is a level-shifted signal biased at a high voltage level (e.g., erase voltage, such as 15V), which serves as logic high and opens Vtop switch 450 and disconnects top supply circuit 455 from Vtop node (where top supply circuit 455 continues to provide the erase voltage).

Vbot switch 460 includes a switching mechanism, such as an n-type transistor or other suitable structure, which receives control signal CTR C at a gate electrode. In the embodiment illustrated in FIG. 5, one current electrode of Vbot switch 460 is coupled to a bottom power supply voltage, where Vbot supply is provided by bottom supply circuit 465 based on the memory operation being implemented. Another current electrode of Vbot switch 460 is coupled to Vbottom node, where Vbottom node provides a low voltage supply rail utilized by program sector circuits 230. In one embodiment, a body electrode of Vbot switch 460 is coupled to Vss. In the embodiment illustrated in FIG. 5, control signal CTR C is active-high, indicating that the Vbot switch connection is closed when CTR C is a logic high voltage level and is open when CTR C is a logic low voltage level.

During a program operation (regardless of whether CG driver 160 is associated with an erase sector that includes selected program sector or with an unselected erase sector), CTR C is a low voltage (non-shifted) signal biased at an intermediate voltage level (e.g., low voltage Vmv, such as 5V), which serves as logic high to close Vbot switch 460 and connects bottom supply circuit 465 to Vbottom node to receive a read voltage (e.g., 1.5V).

During an erase operation where CG driver 160 is associated with a selected erase sector, CTR C is a low voltage (non-shifted) signal biased at a low voltage level (e.g., Vss or 0V), which serves as logic low and opens Vbot switch 460 and disconnects bottom supply circuit 465 from Vbottom node (where bottom supply circuit 465 continues to provide a read voltage). During an erase operation where CG driver 160 is associated with an unselected erase sector, CTR C is a level-shifted signal biased at an intermediate voltage level (e.g., level-shifted Vmv, such as 6V), which serves as logic high to close Vbot switch 460 and connects bottom supply circuit 465 to Vbottom node to receive the read voltage (e.g., 1.5V).

Program sector circuit 230 includes two switching mechanisms, such as a p-type transistor and an n-type transistor, or other suitable structures. The gate electrodes of the switching mechanisms both receive control signal CTR B. In the embodiment illustrated in FIG. 5, the p-type transistor has a current electrode and a body electrode coupled to the high voltage supply rail provided by Vtop node (e.g., coupled to Vtop switch 450). Another current electrode of the p-type transistor is coupled to a current electrode of the n-type transistor, which provides a control gate voltage (Vcg) node that is coupled to a corresponding CG line. Another current electrode and a body electrode of the n-type transistor are coupled to the low voltage supply rail provided by Vbottom node (e.g., coupled to Vbot switch 460).

Vcg node drives the CG line at one of a program voltage level (e.g., 9V), an erase voltage level (e.g., 15V), and a read voltage level (e.g., 1.5V), based on the memory operation being implemented. In the embodiment illustrated in FIG. 5, control signal CTR B is active-low, indicating that the connection between Vcg node and Vtop node is closed while the connection between Vcg node and Vbottom node is open when CTR B is a logic low voltage level, and the connection between Vcg node and Vtop node is open while the connection between Vcg node and Vbottom node is closed when CTR B is a logic high voltage level.

During a program operation where CG driver 160 is associated with a selected program sector, CTR B is a low voltage (non-shifted) signal biased at a low voltage level (e.g., Vss or 0V), which serves as logic low and closes the connection from Vcg node to Vtop node (and opens the connection from Vcg node to Vbottom node), and Vcg node receives the program voltage (e.g., 9V). During a program operation where CG driver 160 is associated with an unselected program sector, CTR B is a low voltage (non-shifted) signal biased at a high voltage level (e.g., program voltage, such as 9V), which serves as logic high and closes the connection from Vcg node to Vbottom node (and opens the connection from Vcg node to Vtop node), and Vcg node receives the read voltage (e.g., 1.5V).

During an erase operation (regardless of whether CG driver 160 is associated with a selected erase sector or an unselected erase sector), CTR B is a level-shifted signal biased at an intermediate voltage level (e.g., level-shifted Vmv, such as 6V), which serves as logic low for the p-type transistor and as logic high for the n-type transistor. In other words, the connection between Vcg node and Vtop node is closed, and the connection between Vcg and Vbottom node is closed. As noted above, during an erase operation where CG driver 160 is associated with a selected erase sector, Vtop switch 450 is closed and Vtop node provides an erase voltage, while Vbottom switch is open, where Vcg node receives the erase voltage. Also, during an erase operation where CG driver 160 is associated with an unselected erase sector, Vtop switch 450 is open, while Vbottom switch is closed and Vbottom node provides a read voltage, where Vcg node receives the read voltage.

Figure 7:
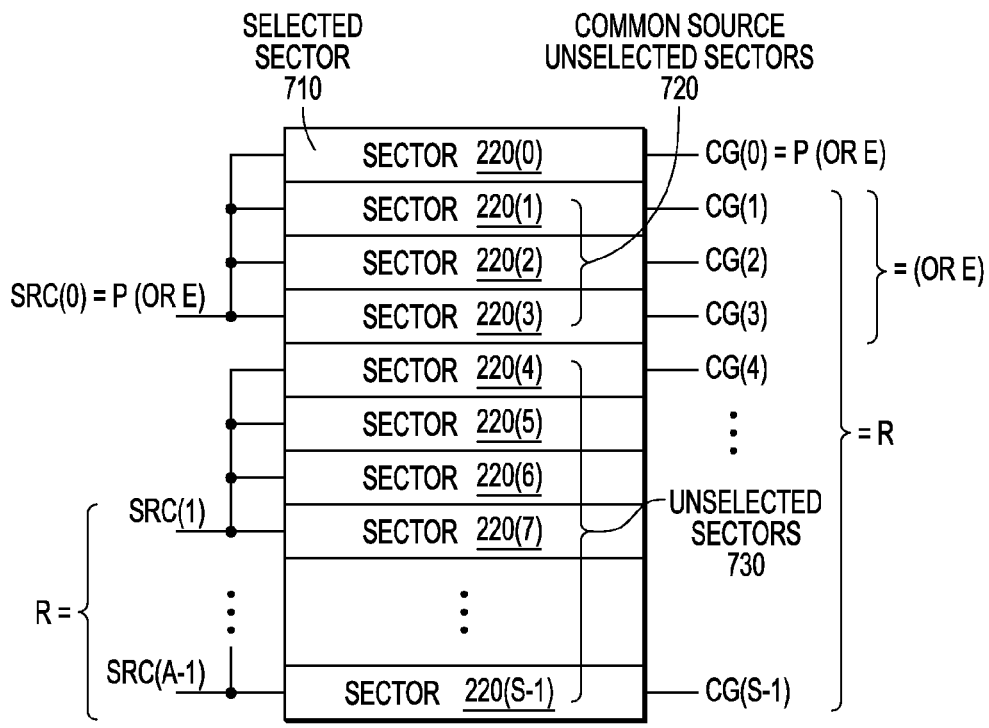
FIGS. 7 and 8 are block diagrams depicting example sector selection schemes in which the present disclosure is implemented, according to some embodiments.

FIG. 7 is a block diagram depicting an example sector selection scheme implemented in an example memory system by control circuitry 140. FIG. 7 corresponds to the example memory system 200 illustrated in FIG. 2, where S=4. Memory cells in program sectors 220(0)-(3) have source lines tied to SRC(0), where program sectors 220(0)-(3) form an erase sector. Memory cells in program sectors 220(4)-(7) have source lines to SRC(1), where program sectors 220(4)-(7) form another erase sector, and so on. Memory cells in program sector 220(0) have CG lines tied to CG(0), memory cells in program sector 220(1) have CG lines tied to CG(1), and so on.

The embodiment illustrated in FIG. 7 selects a targeted program sector 220(0) for a program operation. To do so, the SRC line of the erase sector that includes the targeted program sector is driven to a program voltage P appropriate for the SRC line (shown as SRC(0)=P), while the SRC lines of the remaining erase sectors in the memory array are driven to a read voltage R appropriate for the SRC lines. The CG line of the targeted program sector is driven to a program voltage P (shown as CG(0)=P), while the CG lines of the remaining program sectors of the erase sector are driven to a read voltage R appropriate for the CG lines (shown as CG(1)-(3)=R). This results in sector 220(0) being a single selected sector 710 and sectors 220(1)-(3) being common source unselected sectors 720. The CG lines of the remaining erase sectors are also driven to a read voltage R appropriate for the CG lines. This results in sectors 220(4)-(S−1) being unselected, as indicated by the group of unselected sectors 730.

For an erase operation, it is preferable that an entire erase sector is selected to be erased in order to minimize disturb conditions, although it is possible to erase a single selected program sector (which would increase the time to erase the memory array, as well as introduce disturb conditions to the remaining common source unselected program sectors 720 in the same erase sector). In an example where the entire erase sector that contains program sector 220(0) is targeted for an erase operation, the SRC line of the erase sector is driven to an erase voltage E appropriate for the SRC line (shown as SRC(0)=E). The CG line of all program sectors included in the erase sector are also driven to an erase voltage E appropriate for the CG lines (shown as CG(1)-(3)=E). This results in the erase sector being a selected erase sector. It is noted that if only a single program sector was being selected, the CG line only for that program sector (or selected sector 710) would be driven to erase voltage E, while the CG lines for the remaining program sectors would be driven to a read voltage R appropriate for the CG lines.

The SRC lines of the remaining erase sectors in the memory array are driven to a read voltage R appropriate for the SRC lines, and the CG lines of the remaining erase sectors are driven to a read voltage R appropriate for the CG lines. This results in the remaining erase sectors (and thus program sectors 220(4)-(S−1)) being unselected, as indicated by the group of unselected sectors 730. Examples of erase voltages, program voltages, and read voltages that are appropriate for SRC lines and CG lines are discussed further below in connection with FIG. 9.

Figure 8:
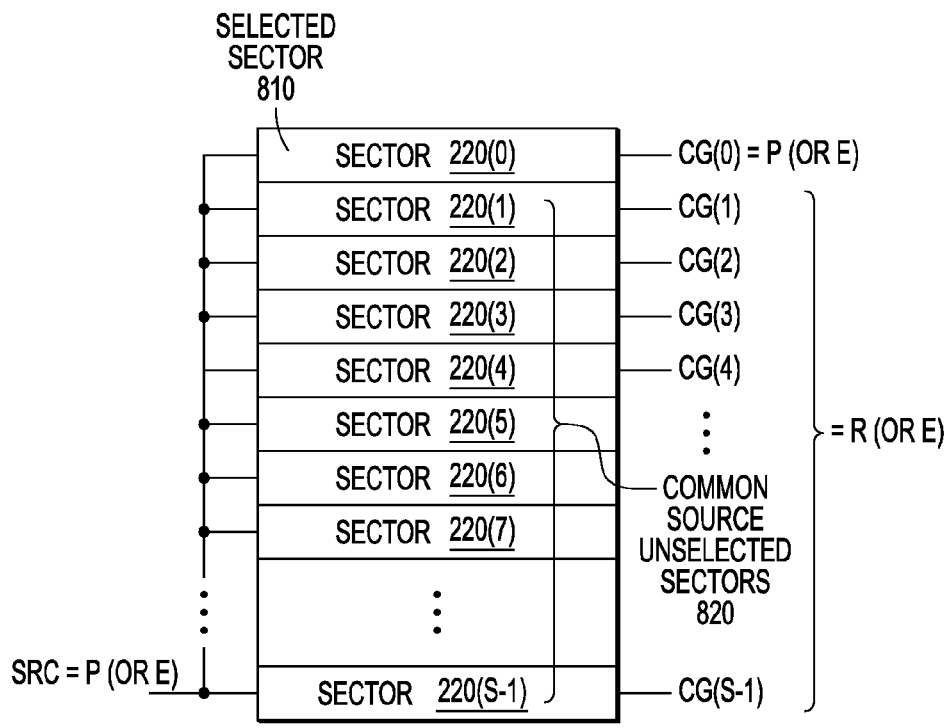

FIG. 8 is a block diagram depicting an example sector selection scheme implemented in an example memory system by control circuitry 140. FIG. 8 corresponds to the example memory system 300 illustrated in FIG. 3, where S is equal to all program sectors available in the memory array. Memory cells in program sectors 220(0)-(S−1) have source lines tied to SRC, where program sectors 220(0)-(S−1) form an erase sector. Memory cells in program sector 220(0) have CG lines tied to CG(0), memory cells in program sector 220(1) have CG lines tied to CG(1), and so on.

The embodiment illustrated in FIG. 8 selects a targeted program sector 220(0) for a program operation. To do so, the (single) SRC line is driven to a program voltage P appropriate for the SRC line (shown as SRC=P). The CG line of the targeted program sector is driven to a program voltage P (shown as CG(0)=PO, while the CG lines of the remaining program sectors in the erase sector are driven to a read voltage R appropriate for the CG lines (shown as CG(1)-(S−1)=R). This results in sector 220(0) being a single selected sector 810 and sectors 220(1)-(S−1) as common source unselected sectors 820.

For an erase operation, it is preferable that an entire erase sector is erased, as discussed above in connection with FIG. 7. In an example where the entire erase sector is targeted for an erase operation, the SRC line is driven to an erase voltage E appropriate for the SRC line (shown as SRC=E). The CG line of all program sectors included in the erase sector are also driven to an erase voltage E appropriate for the CG lines (shown as CG(0)-(S−1)=E). This results in the erase sector being a selected erase sector. It is noted that if a particular program sector is being selected, the CG line for that particular program sector (or selected sector 810) would be driven to erase voltage E, while the CG lines for the remaining program sectors would be driven to a read voltage R appropriate for the CG lines.

FIG. 9 is a chart illustrating example sets of erase voltages, program voltages, and read voltages that are appropriate to be applied to SRC lines and CG lines of program sectors during program and erase operations. A set of SRC and CG voltages are respectively applied to an SRC line and CG line for each type of sector during a given memory operation. During a program operation, a selected sector 910 (such as selected sectors 710 and 810) receives a program voltage P of 5V on the SRC line and a program voltage P of 9V on the CG line. A common source unselected sector 920 (such as sectors 720 and 820) also receives program voltage P of 5V on SRC line (since the SRC line is shared among the program sectors of an erase sector) and a read voltage R of 1.5V on the CG line. An unselected sector 930 (such as sectors 730) receives a read voltage R of 0V on the SRC line and read voltage R of 1.5V on the CG line.

During an erase operation, an entire erase sector (which includes single selected sector 910 and common source unselected sector 920) receives an erase voltage E of 0V on the SRC line and an erase voltage E of 15V on the CG line. It is noted that if a particular program sector is being selected to be erased, the particular program sector would receive E=0V on SRC line and E=15V on CG line, while the remaining program sectors would receive E=0V on SRC line and R=1.5V on CG lines. An unselected sector 930 receives a read voltage R of 0V on SRC line and a read voltage R of 1.5V on CG line.

By now it should be appreciated that there has been provided a common source architecture that amortizes source and control gate driver sizes across a larger array pitch. In one embodiment of the present disclosure, a memory system is provided, which includes an array of split gate non-volatile memory (NVM) cells. Each split gate NVM cell has a control gate and a source, the plurality of split gate NVM cells are arranged into a plurality of program sectors, each program sector of the plurality of sectors has a subset of split gate NVM cells of the plurality of split gate NVM cells, and each program sector has the control gates of its subset of plurality of split gate NVM cells physically shorted together. The memory system also includes a program/erase circuit that programs a selected program sector by applying a programming signal to the control gates of the split gate memory cells of the selected program sector while applying a non-programming signal to the control gates of program sectors not selected for programming, that erases an erase sector including a plurality of the program sectors by contemporaneously applying an erase voltage to the control gates of the split gate NVM cells of the erase sector, wherein during the applying the programming signal, the program/erase circuit applies a source voltage to the sources of each of the split gate NVM cells of the erase sector.

One aspect of the above embodiment provides that the program/erase circuit is further characterized by erasing the array by simultaneously applying the erase voltage to the control gates of all of the split gate NVM cells of all of the program sectors.

Another aspect of the above embodiment provides that the program/erase circuit is further characterized by simultaneously applying the erase signal to the control gates of the split gate NVM cells of the erase sector, wherein the erase sector includes the array.

Another aspect of the above embodiment provides that the plurality of split gate memory cells are divided into a plurality of erase sectors, each erase sector including a plurality of the program sectors; and the program/erase circuit selectively provides an erase signal to a selected one of the erase sectors to erase the selected one of the erase sectors.

A further aspect of the above embodiment provides that each of erase sector of the plurality of erase sectors includes a plurality of program sectors.

Another aspect of the above embodiment provides that the program/erase circuit includes a control gate decoder; a top supply; a bottom supply; and a plurality of control gate drivers. Each erase segment has a control gate driver of the plurality of control gate drivers coupled to the control gates of its split gate memory cells; each control gate driver of the plurality of control gate drivers is coupled to the top supply and the bottom supply; and the control gate decoder has a plurality of outputs, one output of the plurality of outputs for each of the control gate drivers.

A further aspect of the above embodiment provides that the program/erase circuit further includes a source driver circuit coupled to the sources of split gate NVM cells A still further aspect of the above embodiment provides that the array has a plurality of erase sectors; and the source driver circuit having a plurality of selectively enabled outputs, one selectively enabled output for each erase sector.

Another further aspect of the above embodiment provides that the source driver circuit has an output, wherein the output is coupled to all of the erase sectors.

Another further aspect of the above embodiment provides that each control gate driver includes an inverting circuit including a high voltage P channel transistor and a high voltage N channel transistor.

In another embodiment of the present disclosure provides a method of operating a memory system having an array including a plurality of split gate non-volatile memory (NVM) cells, each having a source and a control gate. The method includes dividing the array into a plurality of program sectors in which each program sector is characterized by all of the control gates of each program sector being physically connected together; selecting a program sector for programming while deselecting other program sectors; programming the selected program sector by applying a program voltage to the control gates of the split gate NVM cells of the selected program sector and applying a non-program voltage to the sources of the split gate NVM cells of the deselected program sectors; defining an erase sector including a plurality of program sectors; and erasing the erase sector by applying a control gate erase signal to the control gate of each of the split gate NVM cells in the erase sector and a source erase signal to the source of each of the split gate NVM cells in the erase sector. The programming further includes simultaneously applying a source program signal to each of the sources of the split gate NVM cells of the program sector that includes the selected program sector.

One aspect of the above embodiment provides that the erase sector is the memory array.

Another aspect of the above embodiment provides that the memory array includes a plurality of erase sectors in which each erase sector includes non-overlapping sets of program sectors.

A further aspect of the above embodiment provides that the erasing is further characterized by applying the control gate erase signal selected from a plurality of control gate erase signals.

A still further aspect of the above embodiment provides that the programming is further characterized by simultaneously applying the source program signal selected from a plurality of source program signals.

Another further aspect of the above embodiment provides that the programming is further characterized by providing the programming voltage to a control gate driver and coupling the programming voltage to the control gates of the split gate NVM cells of the selected program sector in response to the control gate driver receiving an asserted control gate select signal.

A still further aspect of the above embodiment provides that the programming is further characterized by providing the non-programming voltage to a plurality of control gate drivers and coupling the non-programming voltage to the control gates of the split gate NVM cells of the de-selected program sectors in response to the plurality of control gate drivers receiving de-asserted control gate select signals.

In another embodiment of the present disclosure, a memory system is provided, which includes an array of split gate non-volatile memory (NVM) cells. The array includes a first program sector and a second program sector; the first program sector and the second program sector include a first erase sector; each split gate NVM cell has a control gate and a source used in program and erase; the sources of the split gate NVM cells of the first program sector are physically connected together; and the sources of the split gate NVM cells of the second program sector are physically connected together. The memory system also includes a control gate decoder; a first gate driver coupled to the control gate decoder; a second gate driver coupled to the control gate decoder; and a first source driver coupled to the sources of the split gate NVM cells of the first erase sector. When programming the first program sector: the control gate decoder enables the first gate driver to provide a program signal to the control gates of the split gate NVM cells of the first program sector; the control gate decoder enables the second gate driver to provide a non-program signal to the control gates of the split gate NVM cells of the second program sector; and the first source driver provides a programming signal to the sources of the split gate memory cells of the first erase sector.

One aspect of the above embodiment provides that the array further includes a third program sector and a fourth program sector; the third program sector and the fourth program sector further include the erase sector; the sources of the split gate NVM cells of the third program sector are physically connected together; and the sources of the split gate NVM cells of the fourth program sector are physically connected together. The memory system further includes a third gate driver coupled to the control gate decoder; and a fourth gate driver coupled to the control gate decoder. When programming the first program sector: the control gate decoder enables the third gate driver to provide the non-program signal to the control gates of the split gate NVM cells of the third program sector; and the control gate decoder enables the fourth gate driver to provide the non-program signal to the control gates of the split gate NVM cells of the fourth program sector.

Another aspect of the above embodiment provides that the array further includes a third program sector and a fourth program sector; the third program sector and the fourth program sector further include a second erase sector; the sources of the split gate NVM cells of the third program sector are physically connected together; and the sources of the split gate NVM cells of the fourth program sector are physically connected together. The memory system further includes a third gate driver coupled to the control gate decoder; a fourth gate driver coupled to the control gate decoder; and a second source driver coupled to the sources of the split gate NVM cells of the second erase sector. When programming the third program sector: the control gate decoder enables the third gate driver to provide the program signal to the control gates of the split gate NVM cells of the third program sector; the control gate decoder enables the fourth gate driver to provide the non-program signal to the control gates of the split gate NVM cells of the fourth program sector; and the second source driver provides a programming signal to the sources of the split gate memory cells of the second erase sector.

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory system, comprising:
a plurality of split gate non-volatile memory (NVM) cells, wherein:
each split gate NVM cell has a control gate and a source,
the plurality of split gate NVM cells are arranged into a plurality of program sectors,
each program sector of the plurality of sectors includes a subset of split gate NVM cells of the plurality of split gate NVM cells, and
each program sector has the control gates of its subset of split gate NVM cells physically shorted together; and
a program/erase circuit configured to
erase a first erase sector that comprises the plurality of program sectors by applying an erase voltage to the control gates of each of the split gate NVM cells of the first erase sector, which includes each subset of split gate NVM cells of the plurality of program sectors; and
program a selected program sector of the plurality of program sectors by simultaneously:
applying a programming signal to the control gates of the split gate NVM cells of the selected program sector,
applying a non-programming signal to the control gates of the split gate NVM cells of program sectors of the plurality of program sectors that are not selected for programming, and
applying a source voltage to the sources of each of the split gate NVM cells of the first erase sector.

2. The memory system of claim 1, wherein:
the plurality of split gate NVM cells are arranged in a memory array.

3. The memory system of claim 2, wherein:
the memory array further comprises a second plurality of split gate NVM cells that are arranged into a second plurality of program sectors,
a second erase sector comprises the second plurality of program sectors, and
the program/erase circuit is further configured to erase the second erase sector by
applying the erase voltage to the control gates of each of the split gate NVM cells of the second erase sector, and
applying a non-erase voltage to the control gates of each of the split gate NVM cells of the first erase sector.

4. The memory system of claim 3, wherein:
the program/erase circuit is further configured to program a selected program sector of the second plurality of program sectors by simultaneously:
applying the programming signal to the control gates of the split gate NVM cells of the selected program sector,
applying the non-programming signal to the control gates of the split gate NVM cells of program sectors of the second plurality of program sectors that are not selected for programming,
applying the non-programming signal to the control gates of the split gate NVM cells of the program sectors of the first erase sector that are not selected for programming, and
applying the source voltage to the sources of each of the split gate NVM cells of the second erase sector.

5. The memory system of claim 3, wherein
the first erase sector has the sources of its split gate NVM cells physically shorted together, and
the second erase sector has the sources of its split gate NVM cells physically shorted together.

6. The memory system of claim 1, wherein the program/erase circuit comprises:
a control gate decoder;
a top supply;
a bottom supply; and
a plurality of control gate drivers,
wherein:
each control gate driver of the plurality of control gate drivers has an output coupled to the control gates of the split gate NVM cells of a respective program sector;
each control gate driver of the plurality of control gate drivers is coupled to the top supply and the bottom supply; and
the control gate decoder has a plurality of outputs, one output of the plurality of outputs coupled to each of the control gate drivers to control the output of the control gate driver.

7. The memory circuit of claim 6, wherein the program/erase circuit further comprises a source driver circuit coupled to the sources of the split gate NVM cells of the first erase sector.

8. The memory circuit of claim 6, wherein:
the top supply comprises the programming signal,
the control gate driver coupled to the control gates of the split gate NVM cells of the selected program sector is controlled to output the programming signal,
the bottom supply comprises the non-programming signal, and
each control gate driver coupled to the control gates of the split gate NVM cells of the program sectors that are not selected for programming are controlled to output the non-programming signal.

9. The memory circuit of claim 8, wherein the non-programming signal comprises a read voltage.

10. The memory circuit of claim 6, wherein each control gate driver comprises an inverting circuit comprising a high voltage P channel transistor and a high voltage N channel transistor.

11. A method of operating a memory system having an array comprising a plurality of split gate non-volatile memory (NVM) cells, each split gate NVM cell having a source and a control gate, the method comprising:
selecting a program sector for programming while deselecting other program sectors,
wherein
the plurality of split gate NVM cells are grouped into a plurality of program sectors, each program sector comprising a set of split gate NVM cells,
the plurality of program sectors are grouped into a plurality of erase sectors, each erase sector comprising a set of program sectors that form a superset of split gate NVM cells, and
the selected program sector is included in a first erase sector;
programming the selected program sector by simultaneously:
applying a program voltage to the control gates of the set of split gate NVM cells of the selected program sector,
applying a non-program voltage to the control gates of each set of split gate NVM cells of the deselected program sectors included in the first erase sector, and
applying a source program signal to the sources of the superset of split gate NVM cells of the first erase sector, which includes the sets of split gate NVM cells of the selected program sector and the deselected program sectors; and
erasing the first erase sector by applying a control gate erase signal to the control gates of the superset of split gate NVM cells of the first erase sector and a source erase signal to the sources of the superset of split gate NVM cells of the first erase sector.

12. The method of claim 11, wherein
the programming the selected program sector further comprises:
applying the non-program voltage to the control gates of each superset of split gate NVM cells of the plurality of erase sectors that do not include the selected program sector, and
applying a source non-program signal to the sources of each superset of split gate NVM cells of the plurality of erase sectors that do not include the selected program sector.

13. The method of claim 11, wherein each erase sector comprises non-overlapping sets of program sectors.

14. The method of claim 11, wherein the control gate erase signal is selected from a plurality of control gate erase signals.

15. The method of claim 11, wherein the source program signal is selected from a plurality of source program signals.

16. The method of claim 11, wherein
the applying the program voltage comprises
controlling a control gate driver to output the program voltage, wherein the control gate driver is coupled to the control gates of the set of split gate NVM cells of the selected program sector, and the program voltage is output in response to the control gate driver receiving an asserted control gate select signal.

17. The method of claim 11, wherein
the applying the non-program voltage comprises
controlling a plurality of control gate drivers to output the non-program voltage, wherein each of the plurality of control gate drivers is coupled to the control gates of each set of split gate NVM cells of the de-selected program sectors included in the first erase sector, and the non-program voltage is output in response to the plurality of control gate drivers receiving de-asserted control gate select signals.

18. A memory system, comprising:
an array of split gate non-volatile memory (NVM) cells, wherein:
the array comprises a first program sector and a second program sector;
the first program sector and the second program sector are comprised in a first erase sector;
each split gate NVM cell has a control gate and a source used in program and erase;
the control gates of the split gate NVM cells of the first program sector are physically connected together; and
the control gates of the split gate NVM cells of the second program sector are physically connected together;
a control gate decoder;
a first gate driver coupled to the control gate decoder;
a second gate driver coupled to the control gate decoder; and
a first source driver coupled to the sources of the split gate NVM cells of the first erase sector,
wherein, when programming the first program sector:
the control gate decoder enables the first gate driver to provide a program signal to the control gates of the split gate NVM cells of the first program sector;
the control gate decoder enables the second gate driver to provide a non-program signal to the control gates of the split gate NVM cells of the second program sector; and
the first source driver provides a programming signal to the sources of the split gate NVM cells of the first erase sector that comprises the first and second program sectors.

19. The memory system of claim 18, wherein:
the array further comprises a third program sector and a fourth program sector;
the third program sector and the fourth program sector are further comprised in the erase sector;
the control gates of the split gate NVM cells of the third program sector are physically connected together;
the control gates of the split gate NVM cells of the fourth program sector are physically connected together; and
the memory system further comprising:
a third gate driver coupled to the control gate decoder; and a fourth gate driver coupled to the control gate decoder,
wherein, when programming the first program sector:
the control gate decoder enables the third gate driver to provide the non-program signal to the control gates of the split gate NVM cells of the third program sector; and
the control gate decoder enables the fourth gate driver to provide the non-program signal to the control gates of the split gate NVM cells of the fourth program sector.

20. The memory system of claim 18, wherein:
the array further comprises a third program sector and a fourth program sector;
the third program sector and the fourth program sector are comprised in a second erase sector;
the control gates of the split gate NVM cells of the third program sector are physically connected together; and
the control gates of the split gate NVM cells of the fourth program sector are physically connected together;
the memory system further comprising:
a third gate driver coupled to the control gate decoder;
a fourth gate driver coupled to the control gate decoder; and
a second source driver coupled to the sources of the split gate NVM cells of the second erase sector,
wherein, when programming the third program sector:
the control gate decoder enables the third gate driver to provide the program signal to the control gates of the split gate NVM cells of the third program sector;
the control gate decoder enables the fourth gate driver to provide the non-program signal to the control gates of the split gate NVM cells of the fourth program sector; and
the second source driver provides a programming signal to the sources of the split gate memory cells of the second erase sector that comprises the third and fourth program sectors.

* * * * *